United States Patent

Tanaka et al.

Patent Number: 6,060,182
Date of Patent: May 9, 2000

[54] HARD COATING MATERIAL, SLIDING MEMBER COVERED WITH HARD COATING MATERIAL AND MANUFACTURING METHOD THEREOF

[75] Inventors: Shoji Tanaka; Nobuyuki Yamashita, both of Shiojiri; Naoki Ito, Okaya, all of Japan

[73] Assignee: Teikoku Piston Ring Co., Ltd., Tokyo, Japan

[21] Appl. No.: 09/090,927

[22] Filed: Jun. 5, 1998

[30] Foreign Application Priority Data

Jun. 9, 1997 [JP] Japan ..................... 9-166562

[51] Int. Cl.$^7$ ............... B32B 19/00; F16J 9/26; C23C 14/06
[52] U.S. Cl. .......... 428/698; 428/217; 501/132; 277/443; 277/444; 508/108; 427/530
[58] Field of Search ............ 501/126, 132; 428/472, 698, 217, 702, 336; 277/443, 444; 427/523, 528, 530; 384/907; 508/108

[56] References Cited

U.S. PATENT DOCUMENTS

| | | |
|---|---|---|
| 5,449,547 | 9/1995 | Miyazaki et al. |
| 5,582,414 | 12/1996 | Miyazaki et al. .......... 277/235 A |
| 5,601,293 | 2/1997 | Fukutome et al. |
| 5,743,536 | 4/1998 | Komuro et al. .......... 277/235 A |
| 5,851,659 | 12/1998 | Komuro et al. .......... 428/336 |

FOREIGN PATENT DOCUMENTS

| | | |
|---|---|---|
| 6-265023 | 9/1994 | Japan . |
| 6-300130 | 10/1994 | Japan . |
| 6-346077 | 12/1994 | Japan . |
| 8-199337 | 8/1996 | Japan . |

*Primary Examiner*—Timothy M. Speer
*Assistant Examiner*—Stephen Stein
*Attorney, Agent, or Firm*—Armstrong, Westerman, Hattori, McLeland & Naughton

[57] ABSTRACT

A hard film is covered on the outer circumferential surface of a piston ring by means of an arc ion plating. The hard film has a mixture of crystal structure of CrN and crystal structure of $Mo_2N$ containing oxygen in a solid solution state, and comprises chromium at 40 to 78 percent by weight, molybdenum at 3 to 35 percent by weight, oxygen at 3 to 20 percent by weight and the remainder of nitrogen. The crystal particle size is less than 1 $\mu$m. The Vickers hardness is within a range from 1600 to 2500. The film thickness is preferably 1 to 60 $\mu$m. Carbon in a solid solution state at 0.5 to 8 percent by weight may be substituted for the oxygen. Alternatively, both oxygen and carbon may be contained in a solid solution state with oxygen at 3 to 20 percent by weight, carbon at 0.5 to 8 percent by weight with the total content of carbon and oxygen within 25 percent by weight.

6 Claims, 3 Drawing Sheets

HARD COATING MATERIAL, SLIDING MEMBER COVERED WITH HARD COATING MATERIAL AND MANUFACTURING METHOD THEREOF

BACKGROUND OF THE INVENTION

1. Field of the Invention

The present invention relates to a hard coating material with improved sliding characteristics, particularly scuffing resistance as for instance used to cover the sliding surfaces of sliding members such as piston rings in internal combustion engines.

2. Description of the Related Art

In recent years, the environment in which piston rings are used has become increasingly harsh due to stricter exhaust emission regulations and higher engine output. To cope with this harsher environment, hard films utilizing physical vapor deposition such as TiN film, CrN film or a hard film with oxygen in a solid solution state in a crystal structure of CrN (Japanese Patent Laid-open No. 6-265023) and a hard film with carbon in a solid solution state in a crystal structure of CrN (Japanese Patent Laid-open No. 6-300130) have been proposed. Furthermore, a composite film of molybdenum nitride ($Mo_xN_y$) and chromium nitride ($Cr_xN_y$) having superior wear resistance (Japanese Patent Laid-open No. 8-199337) has been proposed. Additionally, a film of Cr—Mo—N—O alloy (Japanese Patent Laid-open No. 6-346077) has been proposed. The constituent proportions of the metallic elements of the film and the constituent proportions of the gas elements were merely presented in this official gazette without stipulating the crystal structure.

However, these proposed methods all have the drawback that scuffing resistance still deteriorates under harsh engine conditions.

SUMMARY OF THE INVENTION

The present invention provides improved sliding characteristics, particularly scuffing resistance.

The hard coating material of the present invention has a mixture of crystal structure of CrN and crystal structure of $Mo_2N$. These crystal structures contain oxygen in a solid solution state at a ratio of 3 to 20 percent by weight. The Vickers hardness of the hard coating material is within a range of 1600 to 2500. The crystal particle size is less than 1 μm. The hard coating material comprises chromium at 40 to 78 percent by weight, molybdenum at 3 to 35 percent by weight, oxygen at 3 to 20 percent by weight and the remainder of nitrogen.

The hard coating material of the present invention contains oxygen in a solid solution state, however carbon in a solid solution state at 0.5 to 8 percent by weight may be substituted for the oxygen. The hardness and crystal particle size are the same as related above. This hard coating material comprises chromium at 40 to 78 percent by weight, molybdenum at 3 to 35 percent by weight, carbon at 0.5 to 8 percent by weight and the remainder of nitrogen.

The hard coating material of the present invention may further contain both oxygen and carbon in a solid solution state. In such a case, the oxygen is contained at 3 to 20 percent by weight, and the carbon is contained at 0.5 to 8 percent by weight. The total content of carbon and oxygen is within 25 percent by weight. The hardness and crystal particle size are the same as related above. This hard coating material comprises chromium at 40 to 78 percent by weight, molybdenum at 3 to 35 percent by weight, oxygen at 3 to 20 percent by weight, carbon at 0.5 to 8 percent by weight with the total content of carbon and oxygen within 25 percent by weight and the remainder of nitrogen.

The sliding member of the present invention is covered on at least the sliding surface with a hard film made of the above-mentioned hard coating material. A piston ring, for instance, covered with a hard film made of the hard coating material can have sufficient scuffing resistance and wear resistance even when subjected to harsh operating conditions. The coating of the hard coating material can be applied by ion plating.

When the chromium content is less than 40 percent by weight or in excess of 78 percent by weight, the scuffing resistance declines. The scuffing resistance also declines when the molybdenum content is less than 3 percent by weight or in excess of 35 percent by weight.

The chromium content preferably has an upper limit of 70 percent by weight. The molybdenum content preferably has a lower limit of 8 percent by weight.

The scuffing resistance becomes low when the oxygen content contained in a solid solution state within the crystal structures of CrN and $Mo_2N$ is less than 3 percent by weight or in excess of 20 percent by weight. The scuffing resistance also becomes low when the carbon content contained in a solid solution state within the crystal structures of CrN and $Mo_2N$ is less than 0.5 percent by weight or in excess of 8 percent by weight. The scuffing resistance also becomes low when the total content of oxygen and carbon contained in a solid solution state within the crystal structures of CrN and $Mo_2N$ is in excess of 25 percent by weight.

The oxygen content preferably has a lower limit of 4 percent by weight and an upper limit of 15 percent by weight. The carbon content preferably has a lower limit of 1 percent by weight and an upper limit of 5 percent by weight. The total content of oxygen and carbon is preferably within 20 percent by weight.

The wear resistance becomes low when the Vickers hardness is less than 1600. The scuffing resistance becomes low when the Vickers hardness exceeds 2500. A Vickers hardness within a lower limit of 1650 and an upper limit of 2300 is preferable.

The film adhesion and resistance to peeling at the sliding portions deteriorate when the crystal particle size is 1 μm or more. Crystal particle size is preferably less than 0.1 μm.

BRIEF DESCRIPTION OF THE DRAWINGS

The aforesaid and other objects and features of the present invention will become more apparent from the following detailed description and the accompanying drawings.

DESCRIPTION OF THE PREFERRED EMBODIMENTS

Figure 1:
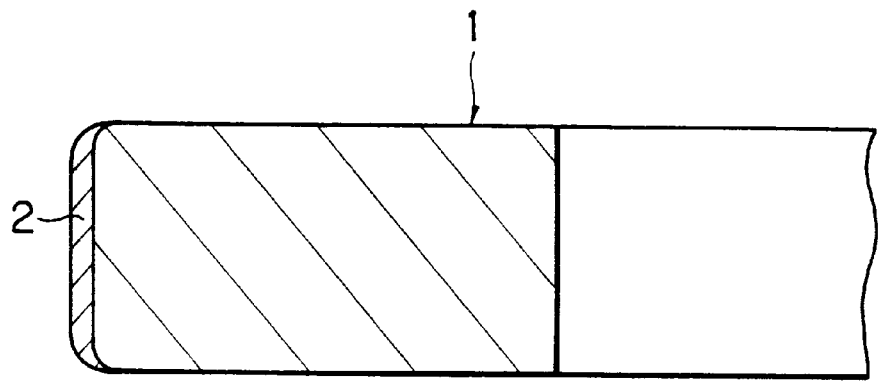
FIG. 1 is a longitudinal cross-sectional view of a portion of a piston ring of one preferred embodiment of the present invention.

FIG. 1 is a longitudinal cross-sectional view of a portion of a piston ring of one preferred embodiment of the present invention. A piston ring 1 of this embodiment is a ring with a rectangular cross-sectional which is made of steel, cast iron, titanium or titanium alloy.

The outer circumferential surface of the piston ring 1 is covered with a hard film 2 by means of an arc ion plating. The hard film 2 has a mixture of crystal structure of CrN and crystal structure of $Mo_2N$. These crystal structures contain oxygen in a ratio of 3 to 20 percent by weight in a solid solution state. The crystal particle size is less than 1 $\mu$m. The hard film 2 comprises chromium at 40 to 78 percent by weight, molybdenum at 3 to 35 percent by weight, oxygen at 3 to 20 percent by weight and the remainder of nitrogen. The hard film 2 has a Vickers hardness within a range of 1600 to 2500 and the film thickness is preferably 1 to 60 $\mu$m.

The hard film 2 contains oxygen in a solid solution state as related above, however carbon in a solid solution state at 0.5 to 8 percent by weight may be substituted for the oxygen. In this case, the hard film 2 comprises chromium at 40 to 78 percent by weight, molybdenum at 3 to 35 percent by weight, carbon at 0.5 to 8 percent by weight and the remainder of nitrogen. Other structures of the hard film 2 are the same as related above when oxygen is contained in a solid solution state.

The hard film 2 may also contain both oxygen and carbon in a solid solution state. In such a case, the oxygen is contained at 3 to 20 percent by weight, and the carbon is contained at 0.5 to 8 percent by weight. The total content of carbon and oxygen is within 25 percent by weight. The hard film 2 in this case comprises chromium at 40 to 78 percent by weight, molybdenum at 3 to 35 percent by weight, oxygen at 3 to 20 percent by weight, carbon at 0.5 to 8 percent by weight with the total content of carbon and oxygen within 25 percent by weight and the remainder of nitrogen. Other structures of the hard film 2 are the same as related above when only oxygen is contained in a solid solution state.

The arc ion plating process is one type of ion plating, wherein a film material is vaporized, ionized by vacuum arc discharge to form a film on the surface of the substrate. This arc ion plating process is characterized by a high ionization rate of the vapor allowing forming of a highly adhesive, high density film.

Figure 2:
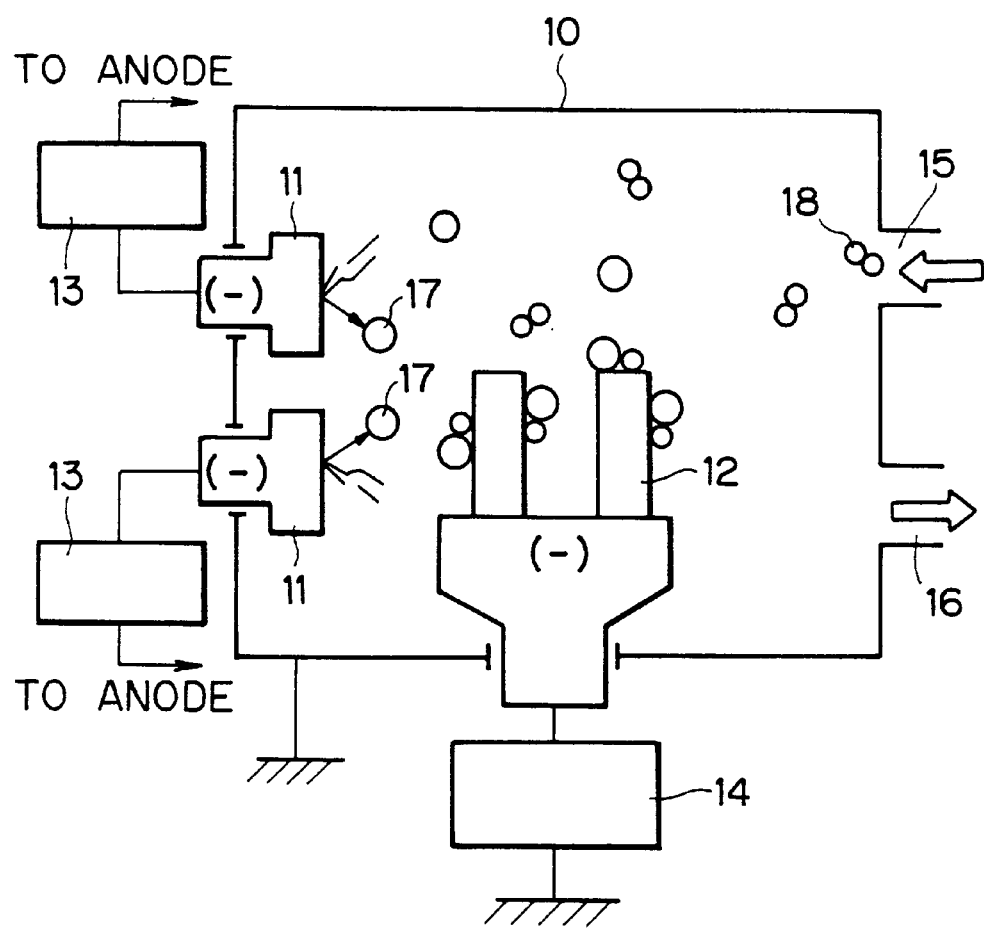
FIG. 2 is a view showing the structure of an arc ion plating apparatus.

A basic configuration of an arc ion plating apparatus will be described in reference to FIG. 2. A cathode 11 composed of a film material and a substrate 12 on which film is formed, are mounted in a vacuum chamber 10. The cathode 11 is connected to an arc supply source 13 installed outside the vacuum chamber 10, and an anode not shown in the figure is connected to the arc supply source 13. A negative bias voltage is applied to the substrate 12 by a bias voltage supply source 14. The vacuum chamber 10 is provided with a gas inlet 15 connected to process gas supply source and a discharging outlet 16 connected to a pump.

Accordingly, at the start of arc discharge between the cathode 11 and the anode in the vacuum chamber 10, the arc concentrates into a point (arc spot) on the surface of the cathode 11, and moves around randomly and fast on the surface of the cathode 11. The energy of the arc current (several tens of amperes to several hundreds of amperes) concentrated in the arc spot instantaneously evaporates and ionizes the material of the cathode 11 to generate metallic ions 17 released into the vacuum space. Then a negative bias voltage which is applied to the substrate 12 accelerates the metallic ions 17 to tightly adhere together with reactive gas molecules 18 on the surface of the substrate 12, producing an extremely fine coating.

In the arc ion plating apparatus of this embodiment, at least two cathodes from among a cathode of chromium metal, a cathode of molybdenum metal, and a cathode of chromium-molybdenum alloy are installed in the vacuum chamber 10. Two cathodes are shown in the figure. The first cathode is for instance made of chromium metal while the second cathode is made of an alloy of chromium and molybdenum. Gases used in the process are nitrogen gas as the source of nitrogen and oxygen gas as the source of oxygen. In this process, a hard film containing oxygen in a solid solution state in crystal structures of CrN and $Mo_2N$ is coated on the piston ring (substrate 12). The amount of the arc current for each cathode 11 can be adjusted separately.

In the above process, constituent amounts of chromium and molybdenum can be adjusted by changing the amount of arc current in the cathode according to the relationship of the deposition rate (evaporation amount of the cathode) and the arc current in the cathode of chromium metal, molybdenum metal, or chromium-molybdenum alloy. Constituent amounts of chromium and molybdenum can also be adjusted by changing the ratio of chromium and molybdenum in the chromium-molybdenum alloy.

When coating the hard film containing carbon in a solid solution state instead of oxygen, the process gas uses $CH_4$ gas, $C_2H_4$ gas or $C_2H_2$ gas as the carbon source instead of the above mentioned oxygen gas.

Further, when coating the hard film containing oxygen and carbon in a solid solution state, the process gas uses $CH_4$ gas, $C_2H_4$ gas or $C_2H_2$ gas as the carbon source in addition to the above mentioned process gas for containing oxygen in a solid solution state.

The oxygen concentration can be controlled by regulating the partial pressure from the oxygen source during ion plating. Increasing the partial pressure from the oxygen source raises the oxygen concentration. Similarly, the carbon concentration can be controlled by regulating the partial pressure from the carbon source during ion plating. Increasing the partial pressure from the carbon source raises the carbon concentration.

The hardness of the film can be adjusted by controlling the bias voltage. Hardness increases as the bias voltage is raised.

Wear tests were performed utilizing the reciprocating friction testing machine in order to evaluate the wear resistance of the hard film 2.

(1) Reciprocating Friction Testing Machine

Figure 3:
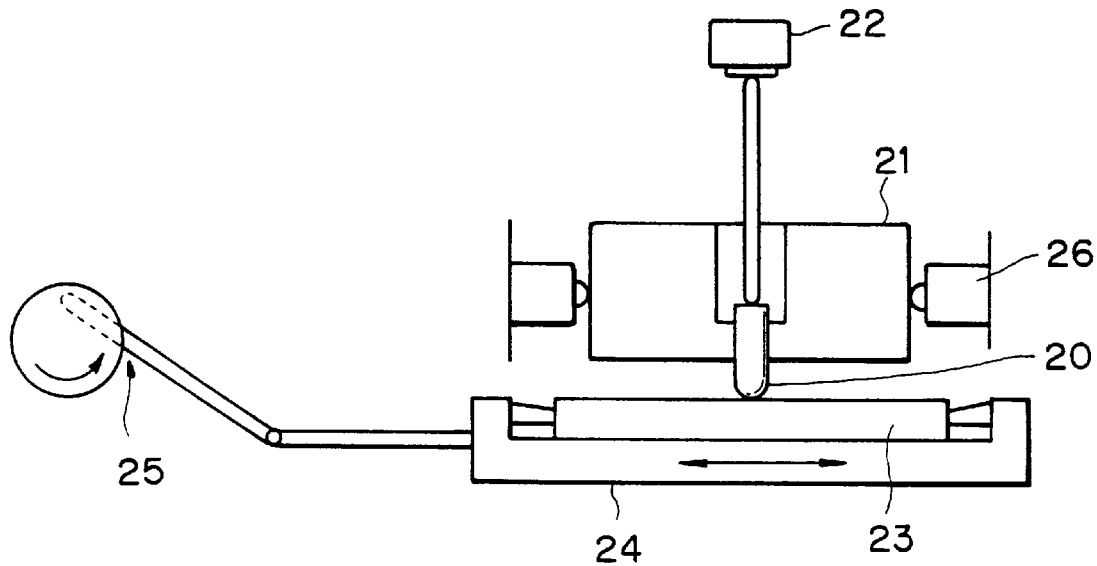
FIG. 3 is a view showing the structure of a reciprocating friction testing machine.

An outline of the reciprocating friction testing machine will be described with reference to FIG. 3.

An upper pin shaped test piece 20 is held by a fixed block 21, and a downward load is applied from above by a hydraulic cylinder 22 to press contact on a lower test piece 23. The rectangular, base shaped lower test piece 23 is held by a movable block 24 and moved back and forth by a crank mechanism 25. A load cell is denoted by the number 26.

(2) Test Piece

Upper test piece 20: The 18 mm radius of the end surface of the steel rod (diameter 8 mm, length 25 mm) was spherical finished. The material of the steel rod was 17% Cr martensitic stainless steel. The spherical end surface of the steel rod was covered with the hard film listed in Table 1 and Table 2.

Lower test piece 23: The flat plate (length 70 mm, width 17 mm, thickness 14 mm) of cast ion (equivalent to JIS FC250)

(3) Test Conditions

| break-in period: | 50 N × 100 cpm × 5 min |
| --- | --- |
| test period: | 300 N × 600 cpm × 60 min |
| Lubricant: | Viscous oil equivalent to light oil |

(4) Test Results

Test results are shown in Table 3. As shown in Table 3, comparative example 10 has a large amount of wear on the upper and lower test pieces compared to comparative example 1. Comparative examples 12–16 has a large amount of wear on the upper test piece. The embodiments 1–8 in contrast, have little wear on the upper and lower test pieces.

TABLE 1

|  |  | Crystal | Content (% by weight) |  |  |  |  | Hardness |
| --- | --- | --- | --- | --- | --- | --- | --- | --- |
|  | No. | Structure | Cr | Mo | O | C | O + C | HV |
| Comparative Example | 1 | CrN + Mo$_2$N | 52 | 26 | 0 | 0 | 0 | 1860 |
|  | 2 | CrN + Mo$_2$N | 18 | 70 | 0 | 0 | 0 | 2110 |
|  | 3 | CrN + Mo$_2$N | 79 | 3 | 3 | 1 | 4 | 1820 |
|  | 4 | CrN + Mo$_2$N | 58 | 15 | 0 | 9 | 9 | 2010 |
|  | 5 | CrN + Mo$_2$N | 70 | 5 | 0 | 0.4 | 0.4 | 1590 |
|  | 6 | CrN + Mo$_2$N | 71 | 2 | 6 | 5 | 11 | 1970 |
|  | 7 | CrN + Mo$_2$N | 41 | 36 | 5 | 4 | 9 | 2020 |
|  | 8 | CrN + Mo$_2$N | 42 | 18 | 18 | 8 | 26 | 2510 |
|  | 9 | CrN + Mo$_2$N | 71 | 1.8 | 2.5 | 0 | 2.5 | 1650 |
|  | 10 | CrN + Cr$_2$O$_3$ + Mo$_2$N | 45 | 15 | 21 | 0 | 21 | 2350 |
|  | 11 | CrN + Mo$_2$N | 39 | 35 | 7 | 0 | 7 | 2450 |
|  | 12 | Cr$_2$N + CrN + Mo$_2$N | 65 | 20 | 5 | 0 | 5 | 1930 |
|  | 13 | Cr + Cr$_2$N + Mo$_2$N | 70 | 19 | 3 | 0 | 3 | 1480 |
|  | 14 | Cr + Cr$_2$N + Mo + Mo$_2$N | 63 | 25 | 5 | 0 | 5 | 1390 |
|  | 15 | Cr$_2$N + CrN + Mo + Mo$_2$N | 58 | 29 | 4 | 0 | 4 | 1500 |
|  | 16 | CrN + Mo + Mo$_2$N | 55 | 34 | 5 | 0 | 5 | 1510 |

In the comparative examples 1–16, the ratio of metallic elements for Mo/(Cr+Mo) [atomic percent] is 21.3, 67.8, 2.0, 12.3, 3.7, 1.5, 32.2, 18.9, 1.4, 15.3, 32.7, 14.3, 12.8, 17.7, 21.3, and 25.1, respectively.

In the comparative examples 9–16, the ratio of gaseous elements for O/(N+O) [atomic percent] is 8.1, 49.2, 24.4, 30.5, 24.8, 38.5, 28.0, and 42.2, respectively.

Crystal particle size is less than 0.1 μm.

TABLE 2

|  |  | Crystal | Content (% by weight) |  |  |  |  | Hardness |
| --- | --- | --- | --- | --- | --- | --- | --- | --- |
|  | No. | Structure | Cr | Mo | O | C | O + C | HV |
| Embodiment | 1 | CrN + Mo$_2$N | 40 | 35 | 7 | 8 | 15 | 2350 |
|  | 2 | CrN + Mo$_2$N | 40 | 20 | 20 | 5 | 25 | 2500 |
|  | 3 | CrN + Mo$_2$N | 78 | 5 | 3 | 0.5 | 3.5 | 2320 |
|  | 4 | CrN + Mo$_2$N | 78 | 3 | 3 | 0 | 3 | 1970 |
|  | 5 | CrN + Mo$_2$N | 45 | 14 | 20 | 0 | 20 | 2410 |
|  | 6 | CrN + Mo$_2$N | 62 | 22 | 0 | 0.5 | 0.5 | 2250 |
|  | 7 | CrN + Mo$_2$N | 52 | 25 | 0 | 8 | 8 | 2310 |
|  | 8 | CrN + Mo$_2$N | 58 | 9 | 4 | 5 | 9 | 1600 |

In the embodiments 1–8, the ratio of metallic elements for Mo/(Cr+Mo) [atomic percent] is 32.2, 21.3, 3.4, 2.0, 14.4, 16.1, 20.6, and 7.8, respectively.

In the embodiments 4 and 5, the ratio of gaseous elements for O/(N+O) [atomic percent] is 14.1, and 45.5, respectively.

Crystal particle size is less than 0.1 μm.

TABLE 3

|  | No. | Wear Test Results Wear Ratios | | | No. | Wear Test Results Wear Ratios | |
| --- | --- | --- | --- | --- | --- | --- | --- |
|  |  | Upper Test Piece | Lower Test Piece |  |  | Upper Test Piece | Lower Test Piece |
| Comparative Example | 1 | 1.0 | 1.0 | Embodiment | 1 | 0.8 | 0.9 |
|  | 2 | 1.1 | 1.0 |  | 2 | 0.9 | 0.9 |
|  | 3 | 1.1 | 1.1 |  | 3 | 0.9 | 0.8 |
|  | 4 | 1.1 | 1.0 |  | 4 | 1.0 | 0.9 |

TABLE 3-continued

| No. | Wear Test Results Wear Ratios | | No. | Wear Test Results Wear Ratios | |
| --- | --- | --- | --- | --- | --- |
|  | Upper Test Piece | Lower Test Piece |  | Upper Test Piece | Lower Test Piece |
| 5 | 1.1 | 1.0 | 5 | 0.9 | 1.0 |
| 6 | 1.0 | 1.1 | 6 | 1.0 | 0.9 |
| 7 | 1.0 | 1.0 | 7 | 0.8 | 0.9 |
| 8 | 1.0 | 1.3 | 8 | 1.0 | 0.8 |
| 9 | 1.1 | 1.0 |  |  |  |
| 10 | 2.5 | 2.4 |  |  |  |
| 11 | 1.0 | 1.1 |  |  |  |
| 12 | 1.5 | 0.9 |  |  |  |
| 13 | 1.9 | 0.7 |  |  |  |
| 14 | 2.0 | 0.8 |  |  |  |
| 15 | 2.0 | 0.8 |  |  |  |
| 16 | 2.0 | 0.7 |  |  |  |

In results from the wear test, the amount of wear of comparative example 1 was set as 1 for wear ratios of both the comparative examples and the embodiments.

Scuffing tests were performed utilizing the high surface pressure scuffing testing machine in order to evaluate the scuffing resistance of the hard film 2.

(1) High Surface Pressure Scuffing Testing Machine

Figure 4:
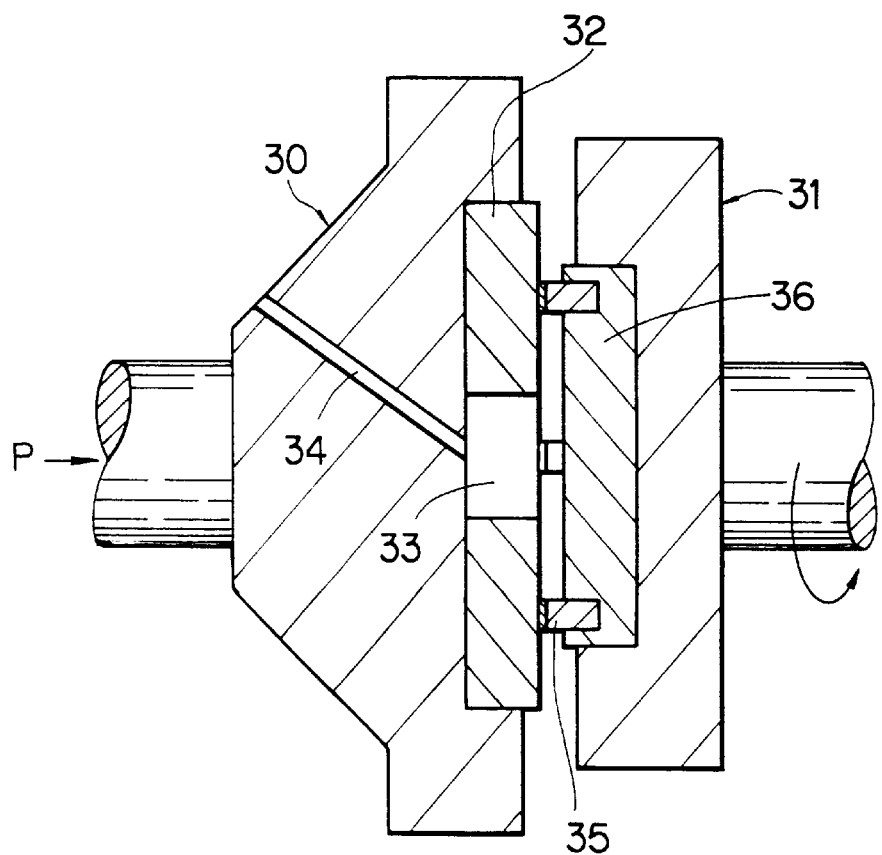
FIG. 4 is a longitudinal cross-sectional view showing the structure of a high surface pressure scuffing testing machine.

As outline of the high surface pressure scuffing testing machine will be described with reference to FIG. 4.

A stator 30 has a circular concave part at a surface facing a rotor 31. A disk 32 (cast ion material: JIS FC 250) is fixed to the concave part. The disk 32 is projected toward the rotor 31. The surface of the disk 32, facing the rotor 31 forms a vertical flat surface. The disk 32 has an oil hole 33 at its central part in the axial direction of the stator 30. The stator 30 has an oil hole 34 communicated with the oil hole 33 in a slant direction. Lubricant oil is supplied to the contact portions between the disk 32 of the stator 30 and pins 35 to be described later, through these oil holes 33 and 34.

The rotor 31 is rotated around the horizontal axis and has a circular concave part at the surface facing the stator 30. A pin holder 36 is concentrically fixed to the rotor 31 at the concave part. At the surface of the pin holder 36 facing the stator 30 are formed four concave parts equally spaced apart on the same circle. Each of the pins 35 (8 mmø) is inserted into these concave parts as test pieces, and fixed there. Each of the pins 35 is projected horizontally from the surface of the pin holder 36 toward the stator 30.

The projecting end surface of each of the pins 35 is covered with the hard film listed in Table 1 and Table 2 and their end surfaces are in contact with the surface of the disk 32 of the stator 30.

Accordingly, a load P is applied to the stator 30 to push the disk 32 against the pins 35. The rotor 31 is then rotated while lubricant oil is supplied to the contact portions between the pins 35 and the disk 32 through the oil holes 33 and 34.

When the load P was varied with the slide speed of the rotor 31 kept constant, the load when the pin 35 was scuffed was measured.

(2) Test Conditions

| Lubricant oil: | 10W Diesel Engine oil |
|---|---|
| Oil temperature: | 80° C. |
| Load, (P): | Increased by 98 N from an initial load of 196 N at a time interval of 3 minutes |
| Slide speed: | 8 m/s constant |
| Temperature: | Room temperature |

(3) Test Results

Test results are shown in Table 4. Comparative examples with satisfactory wear resistance test results were utilized. As shown in Table 4, the embodiments 1–8 have superior scuffing resistance compared to the comparative examples 1–9 and the comparative example 11.

TABLE 4

| | No. | Scuffing Test Results Scuffing Surface Pressure Ratio | | No. | Scuffing Test Results Scuffing Surface Pressure Ratio |
|---|---|---|---|---|---|
| Compar- | 1 | 1.0 | Em- | 1 | 2.2 |
| ative | 2 | 1.1 | bodi- | 2 | 2.0 |
| Example | 3 | 1.0 | ment | 3 | 2.1 |
| | 4 | 1.0 | | 4 | 2.0 |
| | 5 | 1.1 | | 5 | 2.2 |
| | 6 | 1.0 | | 6 | 2.0 |
| | 7 | 1.0 | | 7 | 2.1 |
| | 8 | 1.0 | | 8 | 2.0 |
| | 9 | 1.1 | | | |
| | 11 | 1.0 | | | |

The numbers for the comparative examples in Table 1 and Table 4 match each other, and the same numbers indicate the same film. The numbers for the embodiments in Table 2 and Table 4 match each other, and the same numbers indicate the same film.

In results from the scuffing test, the scuffing surface pressure of comparative example 1 was set as 1 for scuffing surface pressure ratios of both the embodiments and the comparative examples.

The results from engine test are described as follows. A durability test was performed for 300 hours under full load condition. In this test, the top rings were covered on their outer circumferential surfaces with the hard films shown in Table 1 and Table 2 and installed into an inline, four cycle, four cylinder diesel engine with cylinder bores of Ø93 mm.

Test results are shown in Table 5. As can be seen in Table 5, scuffing occurred on the comparative example 1, however no scuffing occurred on the embodiments 1–8.

TABLE 5

| | No. | Scuffing Occurred: YES/NO |
|---|---|---|
| Comparative Example | 1 | YES |
| Embodiment | 1 | NO |
| | 2 | NO |
| | 3 | NO |
| | 4 | NO |
| | 5 | NO |
| | 6 | NO |
| | 7 | NO |
| | 8 | NO |

The numbers for the comparative examples in Table 1 and Table 5 match each other, and the same numbers indicate the same film. The numbers for the embodiments in Table 2 and Table 5 match each other, and the same numbers indicate the same film.

Thus as related above, the hard films of the embodiments have good wear resistance and scuffing resistance particularly.

Figure 5:
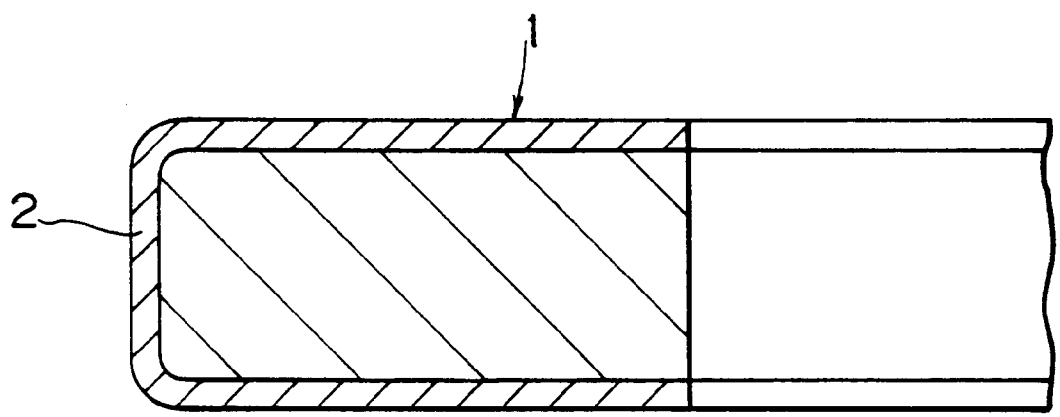
FIG. 5 is a longitudinal cross-sectional view of a portion of a piston ring of another preferred embodiment of the present invention.
Figure 6:
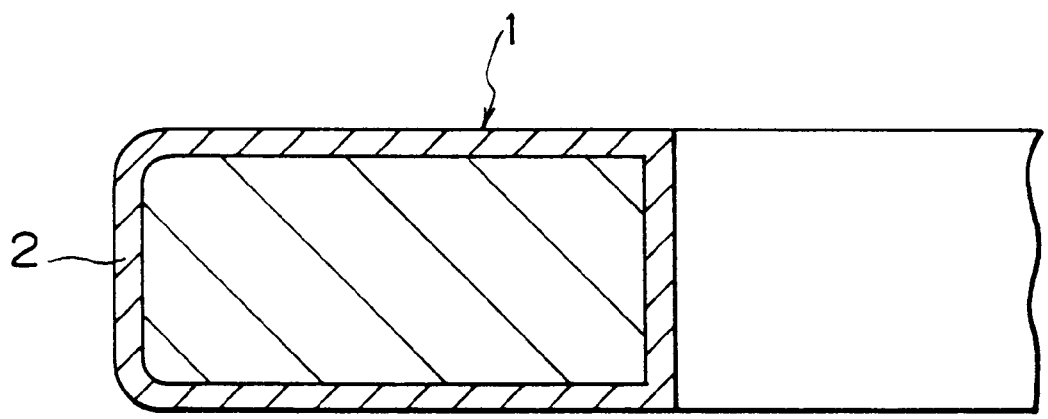
FIG. 6 is a longitudinal cross-sectional view of a portion of a piston ring of still another preferred embodiment of the present invention.

The above embodiment described the hard film 2 covering the outer circumferential surface of the piston ring 1, however as shown in FIG. 5, the outer circumferential surface and the upper and lower surfaces of the piston ring 1 may also be covered with the hard film 2, and further as shown in FIG. 6, the outer circumferential surface, the upper and lower surfaces, and the inner circumferential surface of the piston ring 1 may also be covered with the hard film 2.

In the aforesaid embodiments, although the hard film is applied to the piston ring, the hard film is not limited to piston ring applications. The hard film may be applied to cover at least the sliding surface of other sliding members, for example, a tappet or a cam used as a valve driving member in an internal combustion engine.

Although the present invention has been described with reference to the preferred embodiments, it is apparent that the present invention is not limited to the aforesaid preferred embodiments, but various modification can be attained without departing from its scope.

What is claimed is:

1. A hard coating material having a mixture of crystal structure of CrN and crystal structure of $Mo_2N$ containing at least one selected from oxygen and carbon in a solid solution state in each of said crystal structures, and having a Vickers hardness of 1600 to 2500, and having a crystal particle size of less than 1 $\mu$m, and having constituents comprised of one selected from the following combinations:

(a) chromium at 40 to 78 percent by weight, molybdenum at 3 to 35 percent by weight, oxygen at 3 to 20 percent by weight and the remainder of nitrogen;

(b) chromium at 40 to 78 percent by weight, molybdenum at 3 to 35 percent by weight, carbon at 0.5 to 8 percent by weight and the remainder of nitrogen;

(c) chromium at 40 to 78 percent by weight, molybdenum at 3 to 35 percent by weight, oxygen at 3 to 20 percent by weight, carbon at 0.5 to 8 percent by weight with the total content of carbon and oxygen within 25 percent by weight and the remainder of nitrogen.

2. A sliding member wherein a hard film composed of the hard coating material of claim 1 has been applied to cover at least the sliding surface of the sliding member.

3. A sliding member of claim 2 wherein the member to which said hard film has been applied is a piston ring.

4. A sliding member of claim 2 wherein the thickness of said hard film is within a range from 1 to 60 μm.

5. A sliding member of claim 3 wherein the thickness of said hard film is within a range from 1 to 60 μm.

6. A method for manufacturing a sliding member by an ion plating process wherein the hard coating material of claim 1 is applied to cover at least the sliding surface of the sliding member.

* * * * *